(12) United States Patent
Falcou et al.

(10) Patent No.: US 7,247,761 B2
(45) Date of Patent: Jul. 24, 2007

(54) METHOD FOR THE PRODUCTION OF ARYL-ARYL COUPLED COMPOUNDS

(75) Inventors: Aurelie Falcou, Frankfurt (DE); Jochen Schwaiger, Frankfurt (DE); Andrea Ritter, Mörfelden-Walldorf (DE)

(73) Assignee: Merck Patent GmbH (DE)

( * ) Notice: Subject to any disclaimer, the term of this patent is extended or adjusted under 35 U.S.C. 154(b) by 236 days.

(21) Appl. No.: 10/526,955

(22) PCT Filed: Aug. 20, 2003

(86) PCT No.: PCT/EP03/09199

§ 371 (c)(1),
(2), (4) Date: Jun. 6, 2005

(87) PCT Pub. No.: WO2004/022626

PCT Pub. Date: Mar. 18, 2004

(65) Prior Publication Data

US 2006/0058524 A1    Mar. 16, 2006

(30) Foreign Application Priority Data

Sep. 6, 2002  (DE) .................. 102 41 814

(51) Int. Cl.
*C07C 2/02* (2006.01)
(52) U.S. Cl. .................. 585/427; 564/433
(58) Field of Classification Search ............ None
See application file for complete search history.

(56) References Cited

U.S. PATENT DOCUMENTS

| | | | |
|---|---|---|---|
| 4,326,989 A | 4/1982 | Colon et al. | |
| 5,679,760 A | 10/1997 | Mullen et al. | |
| 5,712,361 A | 1/1998 | Stern et al. | |
| 5,763,636 A | 6/1998 | Kreuder et al. | |
| 5,856,434 A | 1/1999 | Stern et al. | |
| 6,361,884 B1 | 3/2002 | Kreuder et al. | |
| 6,653,438 B1 | 11/2003 | Spreitzer et al. | |
| 2005/0038223 A1 | 2/2005 | Becker et al. | |

FOREIGN PATENT DOCUMENTS

| | | |
|---|---|---|
| DE | 101 43 353 | 3/2003 |
| EP | 0 012 201 | 6/1980 |
| EP | 0 025 460 | 3/1981 |
| EP | 0 690 086 | 1/1996 |
| EP | 0 842 208 | 5/1998 |
| EP | 1 229 063 | 8/2002 |
| JP | 52-154900 | 12/1977 |
| JP | 61-233014 | 10/1986 |
| JP | 2008213 | 1/1990 |
| WO | WO-90/06295 | 6/1990 |
| WO | WO-92/18552 | 10/1992 |
| WO | WO-95/07955 | 3/1995 |
| WO | WO-96/39455 | 12/1996 |
| WO | WO-97/31048 | 8/1997 |
| WO | WO-97/39045 | 10/1997 |
| WO | WO-98/33836 | 8/1998 |
| WO | WO-99/54385 | 10/1999 |
| WO | WO-00/22026 | 4/2000 |
| WO | WO-00/46321 | 8/2000 |
| WO | WO-00/55927 | 9/2000 |

OTHER PUBLICATIONS

Database CAPLUS on STN, Acc. No. 2001:126192, Massicot et al., Tetrahedron (2001), 57(3), p. 531-536 (abstract).*
Database CAPLUS on STN, Acc. No. 1921:3839, Turner, Journal and Proceeedings of the Royal Society of New South Wales (1920), 54, p. 37-39 (abstract).*
Marsitzky et al., "Self-Encapsulation of Poly-2,7-fluorenes in a Dendrimer Matrix", *J. Am. Chem. Soc.*, vol. 123, No. 29, pp. 6965-6972 (2001).

* cited by examiner

*Primary Examiner*—Brian Davis
(74) *Attorney, Agent, or Firm*—Connolly Bove Lodge & Hutz LLP

(57) ABSTRACT

The present invention relates to a process for preparing aryl-aryl-coupled compounds and materials. These materials play an important role in industry, for instance as liquid crystals, pharmaceuticals, agrochemicals and as organic semiconductors. The aryl-aryl couplings hitherto carried out by means of Yamamoto coupling require specific additives in order to give a product suitable for the subsequent use. Particularly in the electronics industry, the Yamamoto coupling needs to meet particular requirements.

19 Claims, No Drawings

METHOD FOR THE PRODUCTION OF ARYL-ARYL COUPLED COMPOUNDS

RELATED APPLICATIONS

This application is a national stage application (under 35 U.S.C. 371) of PCT/EP2003/009199 which claims benefit to German application 102 41 814.4 filed Sep. 6, 2002.

The present invention relates to the preparation of aryl-aryl-coupled compounds and materials. These materials play an important role in industry, for instance as liquid crystals, pharmaceuticals and agrochemicals, to name only a few fields of application. Particularly in the fast-growing field of organic semiconductors (e.g. applications in organic or polymeric light-emitting diodes, organic solar cells, organic ICs), these compounds are of great importance.

Various alternative methods are known for the synthesis of such compounds, but these do not offer a satisfactory solution, e.g. from a technical, economic or ecological point of view, in all cases. In many processes, unsatisfactory products or secondary reactions occur, and such products have to be separated off and disposed of, which costs money, or they cannot be removed and then lead to problems in the use of the material.

A particularly important aspect is the efficiency (degree of conversion & selectivity) of the process when it involves a reaction of one or more multifunctional compound(s). An example of this type of reaction is the reaction of a monofunctional compound with itself, which leads to a discreet molecule. A further example is a polymerization in which one or more multifunctional compound(s) is/are reacted with one or more further multifunctional compound(s). In many applications of the polymers, a high molecular weight is necessary to achieve the desired physical properties, e.g. film formation, flexibility, mechanical stability, etc. In the case of organic semiconductors in particular, the electrical properties are strongly influenced by the molecular weight and a very high molecular weight is usually necessary to avoid, inter alia, defects such as short circuits in the electrical device. Furthermore, in the case of short-chain polymers, the end groups which are inevitably present and in this case make up a relatively high proportion, can act as impurities. A high reproducibility of the process is additionally necessary for this application. The degree of polymerization (DP, average number of repeating units in the chain) of a polymer built up by stepwise growth is related as follows to the degree of conversion of the reaction (p):

$$DP = \frac{1}{1-p}$$

If a high DP is sought, a very efficient reaction is necessary, e.g. a p=0.95 gives DP=20 or a p=0.99 gives a DP=100.

The Yamamoto reaction (T. Yamamoto and A. Yamamoto, *Chem. Lett.*, 1977, 353-356, and Japanese patent application JP 02-008213) has proven to be a suitable reaction for preparing aryl-aryl-coupled compounds. This is the homocoupling of two aromatic halide compounds in the presence of an equimolar amount of a transition metal complex (in general a Ni(0) compound, usually Ni(COD)$_2$, which is not only expensive but also toxic) in a proton-free environment and under an inert atmosphere. It is generally customary for the reaction to be carried out using the somewhat more expensive but significantly more reactive aryl bromides which can readily be synthesized by means of a large number of bromination reactions. An analogous use of this process for polymerization is described, for example, in EP-A-1229063 (Sumitomo Chemicals). Here too, equimolar or even superequimolar amounts of Ni(0) complexes are used, and this is also regarded as necessary.

A number of catalytic variants of the reaction are known, but each suffers from restrictions in terms of its economic utility. Reasons for this are, inter alia, the substrate tolerance, the purification procedure, the catalyst system with its necessary ligands and the reaction yield. These studies (cf. EP-A-0012201, EP-A-0025460, WO 96/39455, WO 90/06295, WO98/33836) nevertheless form the closest prior art to the present patent application and are incorporated by reference into the patent application so that it is not necessary to repeat all the detailed descriptions given there of the general prior art relating to Yamamoto reactions.

In the coupling reactions catalyzed by transition metals which have been carried out by Yamamoto et al. via the Grignard compounds, functional groups which are unstable under Grignard conditions, e.g. ketones and esters, have to be avoided in all cases (Japanese patent application JP 52-154900). This restriction in respect of the choice of substrate limits the number of useful reactions considerably. A variant of this process using zinc in place of the magnesium has been described. (Japanese patent application JP 61-233014).

The more substrate-tolerant variant of this reaction has been disclosed by Colon et al. (I. Colon and D. R. Kelsey, *J. Org. Chem.*, 51, 1986, 2627-2637, European patent applications EP-A-0025460 and EP-A-0012201). Here, a nickel component is reduced in situ with zinc powder in the presence of a phosphine (preferably triphenylphosphine) and a bidentate ligand to produce an active nickel(0)-phosphine catalyst. Without wishing to go into details of the theory of the mechanism, it is assumed (cf., for example, C. A. Tolman, W. C. Seidel and L. W. Gosser, *J. Am. Chem. Soc.*, 96, 1974, 53) that the nickel species loses one or more of its phosphine ligands in the catalytic cycle and forms coordinatedly unsaturated complexes. In some of the catalytic substeps, the unsaturated Ni complex species are essential for the reactivity of the aryl halides, but at the same time are the reason for the formation of undesirable by-products in other substeps. Furthermore, inert complexes which no longer display any catalytic activity can be formed from the coordinatedly unsaturated complexes at high concentrations of these complexes. A second undesirable secondary reaction is the abstraction of a phenyl group from the phosphine ligand and the resulting, undesirable coupling with the aryl halides. This reduces the efficiency of the reaction and increases the degree of purification required in order to isolate the desired product. This secondary reaction can be reduced by increasing the phosphine concentration in the reaction mixture. The concentration of the phosphine ligand, preferably triphenylphosphine and similar triarylphosphines, should be in the range from 1 to 30 equivalents based on the amount of nickel; on the basis of practical experience, a concentration window of from 0.1 to 0.5 mol/l for the phosphine ligand is advantageous (at concentrations of from 0.5 to 1 mol/l for the aryl halide and from 0.01 to 0.05 mol/l for nickel) for minimizing the two abovementioned effects (cf. Wang et al., WO 96/39455). However, the formation of undesirable coupling products is not suppressed under these conditions and the high phosphine additions make costly purification steps necessary afterward.

A bidentate ligand (2,2'-bipyridine, 1,10-phenanthroline, etc.), for instance 0.2-2 equivalents based on the amount of nickel used, can be added to the reaction mixture; larger amounts are not described as advantageous because of its chelating action (Colon et al., *J. Org. Chem.*, 51, 1986, 2627-2637). In addition, a promoter selected from the group consisting of alkali metal, alkaline earth metal, zinc, magnesium and aluminum halides, sulfates and phosphates can be added in an amount of from 1 to 100 equivalents based on the amount of nickel used. As reducing metal, zinc, magnesium or manganese, preferably the first, is used in equimolar amounts based on the aryl halide.

The Colon variant of the Yamamoto reaction is limited to substrates having two substituents in ortho positions relative to the halide; simply ortho-substituted halides likewise display low yields.

In an attempt to minimize the formation of by-products and to solve the purification problem, further processes have been developed.

In WO 96/39455, Wang et al. describe a coupling process for the reaction of aryl halides (preferably chlorides) or aryl sulfonates to produce biaryls and polyaryls. In this process, a catalyst mixture comprising a nickel component, a reducing metal (preferably activated zinc dust) and a phosphite ligand is employed. The ratio of the ligand to the nickel is in the range from 1 to 10 equivalents. However, this process likewise has a number of weak points, of which a few are mentioned in the following:

Firstly, the phosphite ligands required have to be prepared in a complicated synthesis and cannot be recovered from the reaction mixture after the work-up.

Secondly, the chemical structure of the phosphite ligand has a strong influence on the stability of the nickel(0) complexes in the catalytic process and has to be optimized afresh for different substrates.

Thirdly, in the case of relatively unreactive starting materials having electron-pushing substituents in the ortho or para position, an interfering secondary reaction, namely the nickel-catalyzed replacement of the halogen by hydrogen, takes place to a greater extent.

Fourthly, the molecular weights $M_w$ of the polymer products obtained correspond to a degree of polymerization DP in the order of DP<100.

For the abovementioned reasons, the reaction described is not suitable for an efficient polymerization process for obtaining high molecular weights and the use of ligands which are not commercially available represents a particular difficulty.

WO 90/06295 of Eastman Kodak describes a process for preparing biaryl components from aryl chlorides. The use of bidentate organophosphines as ligands is described. The catalyst system further comprises a nickel species (in a ratio of 1:3 equivalents to the phosphine ligand) and a reducing metal such as zinc or the like in an anhydrous, dipolar, aprotic medium. Equimolar amounts of a nitrogen-containing ligand such as bipyridine and also inorganic salts in the range from 1 to 100 equivalents based on the amount of nickel used can optionally be added to the phosphorus-containing ligand.

This process, too, has only limited industrial applicability. Once again, the bidentate phosphine ligands have to be chosen and prepared substrate-specifically. The formation of relatively large amounts of the dehalogenated starting material in the reductive dimerization of substituted aryl halides, on average in the range from 5 to 15%, in some cases up to 60%, may well represent the greatest disadvantage of this process. In addition, isomerically coupled dimers are frequently formed. The preparation of polymeric compounds using this process is not described, and should not succeed because of the abovementioned problems.

In WO 98/33836, Aiike et al. describe the coupling reaction of substituted sulfonyloxyphenylene with itself or various other monomers with the aid of a catalyst system which preferably comprises a nickel salt and a ligand such as triphenylphosphine or 2,2'-bipyridine. These ligands can be added individually or in combination. As reducing agent in the catalytic system, preference is given to using zinc and manganese. An inorganic salt such as NaBr, NaI or tetraethylammonium iodide can be added. However, this patent document is restricted to the abovementioned sulfonyloxyphenylene products.

This critical examination of the prior art makes it clear that there is still a need for highly efficient processes which lead, at a low catalyst concentration, to aryl-aryl-coupled compounds with very few secondary reactions. In the interests of clarity, representative examples from the abovementioned documents are summarized in the following table.

TABLE 1

Literature comparison of known preparative processes.

|  | EP 12201 | WO 96/39455 | WO 90/06295 | WO 96/39455 |
|---|---|---|---|---|
| Starting materials | p-Chloroaniline | 4-Chlorotoluene | 2-Chlorotoluene | 2,5-Dichlorobenzophenone |
| Solvent | DMAC | NMP | DMF | NMP |
| Temperature | 80° C. | 60° C. | 70° C. | 90° C. |
| Concentration of starting material | 1.57 mol/l | 1.58 mol/l | 1.33 mol/l | 0.96 mol/l |
| Molar ratio of starting material to nickel species | 1:0.06 | 1:0.05 | 1:0.05 | 1:0.075 |
| Molar ratio of starting material to ligand | 1:0.5 | 1:0.1 | 1:0.075 with two phosphorus atoms per ligand | 1:0.4 |
| Reaction time | 1 h | 17 h | 16 h | 36 h |
| Yield | 88% (GC) | 96% (GC) | 95% (GC) | 92% |
| $M_w$ [g/mol] | Dimer | Dimer | Dimer | 14.319 |

We have now surprisingly found that a particularly efficient Yamamoto process is achieved when using Ni(0) complexes which have a specific ligand arrangement and a reducing agent together with very small (i.e. catalytic) amounts of Ni.

The invention accordingly provides a process for coupling aromatic or heteroaromatic halogen compounds to form one or more C—C single bonds, characterized in that an Ni(0) complex comprising at least two different ligands, with at least one ligand being selected from each of the two groups consisting of heteroatom-containing ligands (group 1) and of π system ligands (group 2), is used in catalytic amounts, and a reducing agent which converts consumed nickel back into Ni(0) is used;

the reaction takes place in an anhydrous, aprotic medium under a very largely inert atmosphere, with the proviso that no phosphorus-containing compound is added.

The reaction according to the invention can (depending on the precise composition and temperature) occur either in a single-phase system or a multiphase system, or this can change during the course of the reaction. However, the reaction according to the invention preferably occurs in a single-phase.

Aryl and heteroaryl compounds are aromatics and heteroaromatics having from 2 to 40 carbon atoms, which can be substituted by one or more linear, branched or cyclic alkyl or alkoxy radicals which have from 1 to 20 carbon atoms and in which one or more nonadjacent $CH_2$ groups can be replaced by O, C=O or a carboxy group, substituted or unsubstituted C2-C20-aryl or -heteroaryl radicals, fluorine, cyano, nitro groups or can also be unsubstituted.

Simple compounds which are preferably used are the corresponding substituted or unsubstituted derivatives of benzene, naphthalene, anthracene, pyrene, biphenyl, fluorene, spiro-9,9'-bifluorene, phenanthrene, perylene, chrysene, naphthacene, pentacene, triptycene, pyridine, furan, thiophene, benzothiadiazole, pyrrole, quinoline, quinoxaline, pyrimidine and pyrazine.

Furthermore, corresponding (in the sense of the above text) multifunctional compounds are expressly also encompassed, and also the oligomers which have functional aryl or heteroaryl ends and occur in polymerization.

The starting compounds for the process of the invention are aromatic or heteroaromatic halogen compounds of the formula (I),

$$Ar—(X)_n \quad (I)$$

where Ar is an aryl or heteroaryl compound as defined above, X is —Cl, —Br, —I and n is at least 1, preferably from 1 to 20, particularly preferably 1, 2, 3, 4, 5 or 6, but has a value which is not more than the number of aromatic protons which can be present in the starting compound.

In the case of the preparation of linear polymers, preference is given to n being 2 in all monomers used.

The process of the invention is carried out using Ni(0) complexes. These can either be purchased directly (Ni(COD)$_2$ and the like) or in-situ from appropriate precursors or standard solutions, but the catalyst solution is preferably prepared beforehand.

Precursors which can be used for preparing appropriate Ni(0) complexes are, inter alia, the following Ni compounds: elemental nickel or disperse or colloidal metallic nickel, supported or unsupported, e.g. nickel sponge, nickel on kieselguhr, nickel on aluminum oxide, nickel on silica, nickel on carbon, nickel(II) acetate, nickel(II) acetylacetonate, nickel(II) chloride, bromide, iodide, nickel(II) carbonate, ketonates, formate, sulfate, or complexes which can be derived therefrom, e.g. olefinnickel(II) halides, allylnickel(II) halides, addition compounds of the type NiL$_2$X$_2$, where X is chlorine, bromine, iodine and L is an uncharged ligand such as ammonia, acetonitrile, propionitrile, benzonitrile, nickel(II) nitrate, nickel(II) sulfate, nickel(II) oxalate, biscyclooctadienenickel(0), tetrakistriphenylphosphinenickel(0) or further nickel(0) compounds.

As indicated above, the Ni(0) species is preferably prepared beforehand in a catalyst solution. The catalyst solution is generally prepared as follows:

A reducing agent (e.g. Mn) is mixed with, for example, an Ni(II) salt (e.g. NiBr$_2$) dissolved in DMF at room temperature under an inert atmosphere. The ligand solution (e.g. bipyridyl and COD dissolved in toluene) is slowly added, and after 5-10 minutes the solution becomes deep violet. This is stirred vigorously stirred overnight at room temperature. The solution is stable for some weeks under suitable, dry protective gases and is preferably stored and manipulated under a protective gas atmosphere.

The above-described preparation of an Ni(0) complex solution is likewise subject matter of the invention.

Ligands used are, as indicated above, firstly ligands from group 1.

These are defined as follows:

These are generally ligands which have $\eta^1$ coordination via a heteroatom to the nickel. The heteroatoms are preferably heteroatoms of main group 5 and 6, but with the exception of phosphorus; they are particularly preferably nitrogen and/or oxygen. In general, the ligands can be aliphatic compounds (linear or branched) or aliphatic or aromatic cyclic compounds, but preferably monocyclic, bicyclic or tricyclic ring systems.

However, preference is given to the ligands of group 1 being bidentate, i.e. having two $\eta^1$ coordinations to nickel which are each via the heteroatoms. This is the case when the ligands are able to form the bis-$\eta^1$-X,Y-coordinated complex fragment shown in the following scheme, where X and Y are identical or different and are each preferably nitrogen or oxygen,

(where the semicircle depicted represents an alkyl or aryl bridge described in the text).

Individual examples which may be mentioned are the following:

1. When X and Y are each nitrogen, this ligand is of the type of 2,2'-bipyridine, 1,10-phenanthroline, 1,1'-bisisoquinoline, 2,2'-biquinoline, 1,8-diazabicyclo[5.4.0]undec-7-ene and the like. Likewise possible are ligands of the type of, as illustrated by way of example in the scheme below, pyridines substituted in the 2 position by methanamine or imidoyl groups, e.g. α-ethyl-α-methyl-N,N-[diisopropyl]-2-pyridylmethanamine or 2-(N-methylacetimidoyl)pyridine and the like.

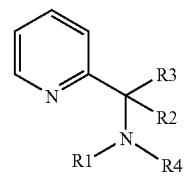 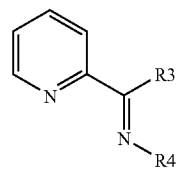

(R1, R2, R3 and R4 can each be, independently of one another, for example a hydrogen atom, alkyl or aryl radical, with the pyridine ring itself also being able to be substituted further.)

2. When X is nitrogen and Y is oxygen, the ligands are, for example, ligands of the type of the pyridines substituted in the 2 position by 1-alkoxyalkyl or carbonyl groups and shown by way of example in the following scheme, e.g. 2-(1-methoxy-1-methylethyl)pyridine or 2-acetylpyridine or 2-pyridinecarbaldehyde and the like.

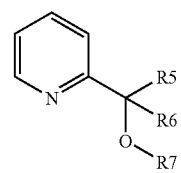 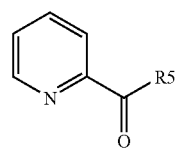

(R5, R6 and R7 can each be, for example, a hydrogen atom, alkyl or aryl radical, where the pyridine ring itself can also be substituted further.) Ligands of the type of substituted or unsubstituted 8-alkoxyquinoline are likewise included.

3. When X and Y are each oxygen, the ligands are, for example, ligands of the type of the furans substituted in the 2 position by 1-alkoxyalkyl or carbonyl groups and shown in the following scheme, e.g. 2-(1-ethyl-1-methoxy-propyl)furan or 2-acetylfuran or 2-furaldehyde and the like.

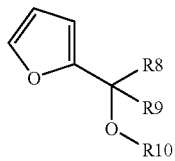 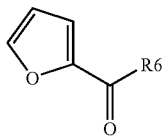

(R8, R9 and R10 can each be, for example, a hydrogen atom, alkyl or aryl radical, with the furan ring itself also being able to be substituted further).

4. When X is oxygen and Y is nitrogen, these ligands are the N-alkyl or N-arylimine and -amine derivatives derived from the above-described ligands and shown by way of example in the following scheme.

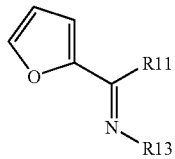 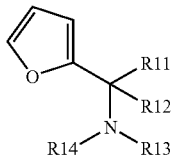

(R11, R12, R13 and R14 can each be, independently of one another, for example a hydrogen atom, alkyl or aryl radical, with the furan ring itself also being able to be substituted further.)

5. Ligands of the type of vicinal, N- or O-difunctionalized alkenes as shown by way of example in the following scheme are therefore likewise possible. R15, R16, R17, R18, R19 and R20 can each be, independently of one another, for example a hydrogen atom, alkyl or aryl radical.

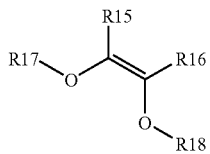 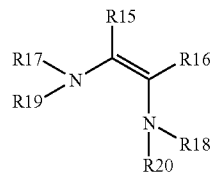

Furthermore, ligands from group 2 are used in addition. These are defined as follows:

In general, these are ligands which have $\eta^2$ coordination via a π system to the nickel. The π system is preferably an alkyne, alkene, $\eta^2$-coordinated imine or $\eta^2$-coordinated carbonyl group, particularly preferably an alkyne or alkene group, very particularly preferably an alkene group. In general, the compounds concerned can be aliphatic compounds which are linear, branched or cyclic, in which some $CH_2$ groups may also be replaced by individual heteroatoms (e.g. oxygen, i.e., for example, ether bridges) and which comprise the appropriate π system, but are preferably monocyclic, bicyclic or tricyclic ring systems. However, preference is given to the ligands of group 2 also being bidentate, i.e. having two $\eta^2$ coordinations to the nickel which are each via the π systems. This is the case when the ligands are able to form the bis-$\eta^2$-A,B-coordinated complex fragment shown in the following scheme, where A and B are two identical or different π systems,

(where the semicircle depicted represents a bridge described in the text below).

As bridge, it is possible to employ, for example, the following structures:

1. Relatively short alkyl fragments (linear or branched) which may also contain individual heteroatoms (e.g. as an ether group). Preference is given to the π systems being separated from one another by from one to three, preferably two, $CH_2$ groups or equivalent bridging units.

2. Cyclic systems, for example monocyclic, bicyclic or tricyclic ring systems having from 6 to 14 carbon atoms of which individual carbon atoms can, as described above, be replaced by heteroatoms. Very particularly useful cyclic systems are substituted or unsubstituted rings selected from among the types of compounds 1,4-cyclohexadiene, norbornadiene, bicyclo[2.2.2]octa-1,4-diene, 1,4-cycloheptadiene, 1,5-cyclooctadiene, ,1,5-cyclononadiene, various cis- or trans-decalindienes, for example cyclooctadiene derivatives.

The invention provides for at least one ligand from the 1st group and at least one ligand from the 2nd group to be present in the active Ni(0) complexes used. In the process of the invention, the Ni(0) compound is used in catalytic amounts. This means that less than 50 mol % of Ni compound (based on the amount of halide), preferably less than 5 mol %, in the case of dimerization reactions very particularly preferably less than 3 mol %, is used. However, to achieve a satisfactory reaction rate in polymerizations, it is advisable to use an Ni(0) concentration which is not too low. Thus, 5 mol % of Ni compound is an appropriate lower limit in polymerizations.

To carry out the process of the invention, it is necessary to have, as described above, a reducing agent which reduces "consumed" nickel(II) back to Ni(0). Possible reducing agents are all elements or compounds of the electrochemical series having a redox potential which is more negative than that of $Ni^{2+}$ (–0.257 V), preferably aluminum, manganese, iron, zinc, sodium, calcium, magnesium, very particularly preferably manganese powder having a purity of 99.99%. It is likewise possible to use more complex reducing agents such as metal hydrides, hydrazine and further organic and inorganic reducing agents.

This reducing agent is used in a stoichiometric ratio (based on the amount of halide) in the range from 0.5 to 10 equivalents, very particularly preferably in the range from 2 to 6 equivalents.

The process of the invention preferably takes place in solution. In the case of suitable reactants (i.e. ones where both the starting materials and the products or the mixture of starting material and product are liquid in the chosen reaction range [p, T]), the starting material(s) can itself/themselves serve as solvent.

Suitable solvents are inert, aprotic solvents, preferably relatively nonpolar solvents such as aliphatic and aromatic hydrocarbons, e.g. pentane, cyclohexene, toluene, xylene and the like, or saturated, open-chain or cyclic ethers, e.g. diethyl ether or tetrahydrofuran, particularly preferably aromatic hydrocarbons, very particularly preferably toluene. These can be mixed with inert, dipolar solvents such as N,N'-dimethylformamide, N,N'-dimethylacetamide, N-methylpyrrolidin-2-one, tetramethyl-urea, dimethyl sulfoxide or sulfolane and the like in any mixing ratio, for example in the particularly useful mixture of DMF and toluene in a DMF:toluene ratio of $\leq$1:20. The process of the invention using the catalytic amounts described gives the good yields reported in the examples below when oxygen and protic compounds, in particular water and alcohols, are very substantially excluded.

It is therefore advantageous to keep the oxygen content in the reaction atmosphere below 1%, preferably below 1000 ppm, particularly preferably below 10 ppm, very particularly preferably below 1 ppm.

An analogous situation applies to protic compounds (for example water).

These reaction conditions are achieved, in particular, by carrying out the reaction under an appropriate oxygen-free or low-oxygen protective gas such as argon or nitrogen, preferably argon, or saturating the solvent(s) and reactants with this gas beforehand. This is preferably achieved by multiple degassing of the solvents and/or passing protective gas through the solvent.

To avoid protic impurities and water or to bring the content to the abovementioned values, use is either made of appropriate grades or the solvents are dried or purified by appropriate literature methods (cf., for example, "Purification of Laboratory Chemicals", $2^{nd}$ Edition, Pergamon Press Ltd., 1980).

The reaction should then preferably be carried out in suitable apparatuses, very particularly preferably in apparatuses which have previously been flushed well with dry protective gas, e.g. argon.

The starting materials, the reaction mixture and the products should preferably be stored, processed and manipulated under a protective gas atmosphere; this applies very especially to the reagents manganese and bipyridine and the reagents corresponding to these, and also naturally to any catalyst solution prepared beforehand from these. The same applies to the solutions of the polymers synthesized. If the process is carried out on a laboratory scale, it can be useful to work in a glove box.

The process of the invention is generally only slightly exothermic and usually requires gentle activation. The process is therefore frequently carried out at temperatures above room, temperature. A preferred temperature range is therefore the range from room temperature to the boiling point of the reaction mixture, particularly preferably the temperature range from 40 to 120° C., very particularly preferably the range from 40 to 60° C. However, it is also possible that the reaction proceeds sufficiently rapidly even at room temperature, so that no active heating is required.

The reaction is carried out with stirring, and simple stirrers or high-viscosity stirrers can be employed depending on the viscosity of the reaction mixture. In the case of high viscosities, baffles can also be used.

The concentration of the reaction components depends very much on the respective reaction. While polymerizations are usually (because of the viscosity increase which occurs in this case) carried out at concentrations in the range below 0.5 mol/l (based on C—C bonds to be formed), a higher concentration range can be employed in the synthesis of defined individual molecules.

The reaction time can in principle be chosen freely and is adapted to the respective reaction rate. An industrially appropriate range is from a few minutes to 120 hours, in the case of dimerization reactions preferably from 60 minutes to 48 hours, but can exceed these values in the case of relatively unreactive starting materials or sluggish polymerization reactions.

In principle, the reaction proceeds under atmospheric pressure. However, under industrial conditions, it can be advantageous to work under superatmospheric or subatmospheric pressure. This depends very much on the individual reaction and on the available equipment.

The advantages of the novel process described are, inter alia, the following:

Excellent efficiency (degree of conversion), as a result of which materials which have very few flaws resulting from secondary reactions are obtained. Particularly in the case of multifunctional compounds, the process of the invention is advantageous since the efficiency is then of great importance. Especially in the case of polymerizations in which the starting materials have, in the case of linear polymers, two reactive groups and the multiple successive aryl-aryl coupling leads to the formation of a chain molecule, the products of the process of the invention display extraordinarily high chain lengths and molecualr weights.

A particular advantage of the present invention is that, owing to the improved efficiency of the Yamamoto reaction in the polymerization, the amount of Ni(0) compound used can nevertheless be kept smaller. This results in the process being both economically and ecologically advantageous and, in addition, the residual amount of nickel in the product being lower. This brings technical advantages, e.g. avoidance of discoloration of the product, but the reduction in the amount of such impurities is particularly advantageous in the case of organic semiconductors since the presence of metal residues leads to adverse effects in use. In general, it is possible to bring the residual nickel content to below 1000 ppm, usually below 100 ppm and very frequently below 10 ppm or even below 1 ppm, by means of simple purification procedures. This is an outstanding feature of the process of the invention, since it clearly distinguishes the products produced in this way from the prior art.

In addition, appreciable contamination by the waste products of the P-containing ligands is, in particular, avoided in the process of the invention. The avoidance of the known, complicated purification procedures when using P-containing ligands represents a further decisive improvement over the prior art achieved by the process of the invention. In particular, the avoidance of these P-containing ligands leads to no P-containing impurities (originating from the ligands) being present in the product. This applies especially in the case of polymers, since processes of the prior art frequently lead to such phosphine-containing groups being transferred into the polymer (as end groups) and in this way avoiding removal in the purification. The polymers obtained by the process of the invention are thus distinguished from the prior art by the fact that they are free of phosphorus. The phosphorus content of the polymer is less than 10 ppm, preferably less than 1 ppm.

The isolation of the product from the reaction mixtures is, according to the invention, preferably carried out, as in the representative examples below, by filtration of the reaction mixture through Celite and subsequent extraction with 1M HCl or other suitable work-up methods. The products produced can then be purified further by standard methods such as recrystallization, distillation under atmospheric or subatmospheric pressure, precipitation or reprecipitation, chromatography, sublimation and the like.

Since the process of the invention has, as described above, a very high efficiency, a preferred embodiment is the conversion of multifunctional molecules into polymers. For the purposes of the present patent application, multifunctional means that a compound has a plurality of (e.g. two, three, four, five, etc.) identical or similar functional units which all react in the same way to form a product molecule in the reaction in question (here the Yamamoto reaction). The reaction of multifunctional compounds is here primarily the reaction to form a product having polymeric character. This too is expressly a Yamamoto reaction for the purposes of the present invention.

Polymeric character, according to the present invention, is present when the decisive properties (e.g. solubility, melting point, glass transition temperature, etc.) do not change or change only insignificantly on addition or omission of a single repeating unit. A simpler definition is provided by the degree of polymerization DP, according to which "polymeric character" is then defined as a degree of polymerization in the order of DP>100; below this, the compounds are regarded as oligomers.

The polyarylenes (in the present context, this term also encompasses copolymers comprising additional non-arylene or non-heteroarylene units in the main chain) produced using the process of the invention are characterized by a high molecular weight (which can also be set in a controlled fashion) and the absence (or very small proportion) of structural defects produced by the polymerization. The process of the invention makes it possible to obtain polyarylenes having a DP of greater than 100, preferably greater than 200, in particular 300.

These polymers produced by the process of the invention therefore offer significant improvements over the prior art and are thus likewise subject matter of the invention.

As described above, a further preferred embodiment of the process of the invention is its use for coupling monofunctional compounds.

The dimeric compounds produced in this way are characterized by the absence (or very small proportion) of structural defects produced by the reaction, e.g. positional isomers or hydrodehalogenation products.

These compounds produced by the process of the invention therefore offer significant improvements over the prior art and are thus likewise subject matter of the invention. The particular insensitivity of the process described to substituent effects makes the use of a substantially larger number of starting materials possible. These include starting materials having substitution patterns which have hitherto not been able to be coupled by Yamamoto reactions (e.g. doubly ortho-substituted aryl halide).

A preferred process according to the invention (dimerization or polymerization) can be described as follows:

The reaction apparatus is firstly dried, the chosen solvent (e.g. toluene) is then degassed and blanketed with argon.

The prepared catalyst mixture is mixed with the reducing agent, e.g. manganese, and stirred under argon at, for example, 50° C.

The starting materials (monomers) are dissolved in a suitable solvent, e.g. toluene, and the reaction is started by addition of the starting material solution to the catalyst solution.

If appropriate, small amounts of monofunctional compounds ("end cappers") or trifunctional or multifunctional groups ("branchers") are added.

The reaction is maintained at the reaction temperature while stirring vigorously and is carried out over a period of about 48-120 hours.

It has been found to be advantageous to carry out end capping at the end of the reaction, i.e. to add monofunctional compounds which cap any reactive end groups in the polymers.

At the end of the reaction, the polymer can then be purified further by customary purification methods such as precipitation, reprecipitation, extraction and the like. For use in highly demanding applications (e.g. polymeric light-emitting diodes), contamination with organic substances (e.g. oligomers) and inorganic substances (e.g. Ni residues, residues of the reducing agent) generally has to be brought to a very low level. In the case of Ni and metallic reducing agents, this can be achieved in various ways, e.g. by means of ion exchangers, liquid-liquid extraction, extraction with complexing agents and other methods, while the removal of low molecular weight material can occur, for example, by solid-liquid or liquid-liquid extraction or by multiple reprecipitation, and the removal of further inorganic impurities can occur, for example, by the methods described above for nickel and the low molecular weight material and also by extraction with, for example, mineral acids.

The process described here makes it possible to prepare, for example, polyarylenes as described in EP-A-842.208, WO 00/22026, WO 00/46321, WO 99/54385, WO 00/55927, WO 97/31048, WO 97/39045, WO 92/18552, WO 95/07955, EP-A-690.086 and the as yet unpublished applications DE 10114477.6 and DE 10143353.0 particularly efficiently. The polymers prepared by the process of the invention frequently display advantages over those reported in this cited literature: for example in respect of the freedom from defects, the molecular weight, the molecular weight distribution and thus frequently also in respect of the respective use properties.

The invention thus also provides poly(arylenes) which are characterized in that they have been prepared by the process described above and have a particularly low occurrence of defects, in particular of poly(arylenes), which have a phosphrus content of less than 10 ppm.

The polymers of the invention can be used in electronic components such as organic light-emitting diodes (OLEDs), organic integrated circuits (O-ICs), organic field effect transistors (OFETs), organic thin film transistors (OTFTs), organic solar cells (O-SCs), organic laser diodes (O-lasers), organic color filters for liquid crystal displays or organic photoreceptors. These uses are likewise subject matter of the present invention.

The invention described is explained by the description and the examples given below, but is not in any way restricted to these. Rather, a person skilled in the art will naturally easily be able to apply the information provided to the systems listed above and those described in the literature cited.

EXAMPLES OF THE PROCESS OF THE INVENTION

Example V1

Preparation of the Catalyst Solution

Manganese (0.11 g, 2 mmol) was mixed at room temperature with $NiBr_2$ (200 mg, 0.9 mmol) dissolved in DMF (5 ml). The ligand solution consisting of 150 mg (0.96 mmol) of bipyridine and 0.12 ml (1.0 mmol) of COD dissolved in 15 ml of toluene) was slowly added, and the solution became deep violet after 5-10 minutes. The mixture was stirred vigorously at room temperature for one night. This solution was stable for some weeks under argon.

A1: Preparation of Dimeric, Multifunctional Compounds

Example D1

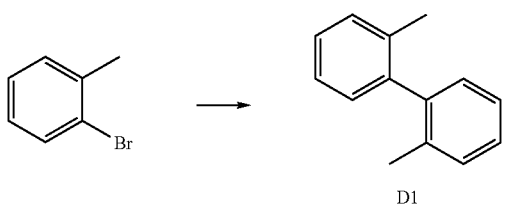

D1

Manganese (1.6 g, 30 mmol) and the catalyst solution (11 ml) were stirred at 50° C. for 10 minutes under argon. The mixture had a stable violet color. 2-bromotoluene (3.4 g, 20 mmol) in 50 ml of toluene was then added, and the reaction mixture turned red. The reaction mixture was stirred at 50° C. for 48 hours (until the solution became violet again). The mixture was then cooled to room temperature, filtered through Celite and evaporated on a rotary evaporator. The residue was dissolved in $CH_2Cl_2$ and washed with 1M HCl (100 ml) and water. The organic phase was dried over $Na_2SO_4$, filtered and evaporated on a rotary evaporator. Chromatography (silica gel, eluent:hexane) gave 1.7 g (yield: 94%) of the desired product (D1) which according to HPLC had a purity of 99.9%.

$^1$H NMR ($CDCl_3$): 7.41 ppm (m, 4H); 7.37 ppm (m, 2H); 7.27 ppm (dd, 2H), 2.23 ppm (s, 6H); HPLC: 95% MeOH/ THF (9:1)+5% of water; 1 ml/min, Stablebond SB-C18; 3.5 μm; 4.6×75 mm, 40° C., UV/VIS detection.

Example D2

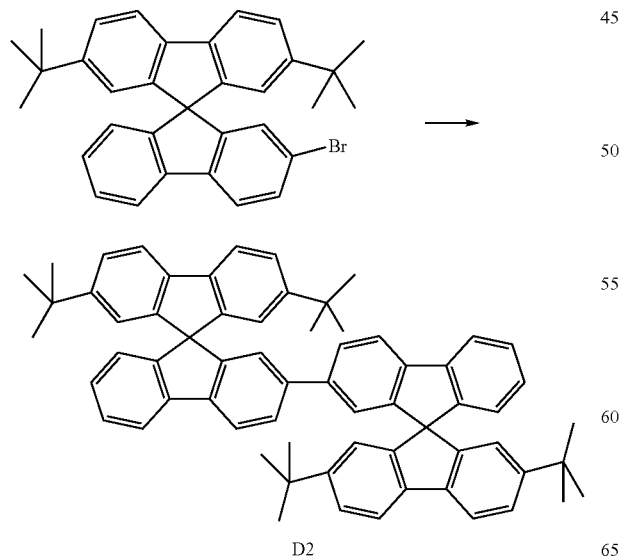

D2

Variation 1:

Manganese (0.3 g, 5.4 mmol) and the catalyst solution (1 ml) was stirred at 50° C. for 10 minutes under argon. The mixture had a stable violet color. The starting material (1.01 g, 2 mmol) was then added as a solution in 10 ml of toluene, and the reaction mixture turned deep red. The reaction mixture was stirred at 50° C. for 48 hours. The mixture was then cooled to room temperature, filtered through Celite and evaporated on a rotary evaporator. The residue was dissolved in $CH_2Cl_2$ and washed with 1M HCl (100 ml) and water. The organic phase was dried over $Na_2SO_4$, filtered and evaporated on a rotary evaporator.

This gave 820 mg (yield: 96%) of the desired product (D2) which according to HPLC had a purity of 98%, and also 2% of debrominated starting material.

$^1$H NMR ($CDCl_3$): 7.79 (2H, d, J=7.34 Hz); 7.74 (2H, d, J=7.98 Hz); 7.69 (4H, d, J=7.93 Hz); 7.30-7.38 (8H, m); 7.05 (2H, dt, J=7.91 Hz, J=1.03); 6.87 (2H, d, J=1.39 Hz); 6.67 (2H, d, J=7.61 Hz); 6.62 (4H, d, J=1.39 Hz); 1.10 (36H, s). $^{13}$C NMR ($CDCl_3$): 150.68, 150.04, 149.91, 148.90, 141.20, 140.86, 140.66, 139.24, 127.60, 127.35, 126.72, 124.74, 124.09, 122.55, 120.61, 119.83, 119.78, 119.05, 66.29, 34.74, 31.37.

Variation 2:

Manganese (0.3 g, 5.4 mmol) and the starting material (1.01 g, 2 mmol) dissolved in 10 ml of toluene were stirred at 50° C. for 10 minutes under argon. The violet catalyst solution (1 ml) was added. The reaction mixture became deep red. Further observations are analogous to variant 1.

Variation 3:

Manganese (0.33 g, 6 mmol) was mixed at room temperature with $NiBr_2$ (20 mg, 0.09 mmol) dissolved in DMF (0.5 ml). The ligand solution (15 mg (0.096 mmol) of bipyridyl and 0.012 ml (0.1 mmol) of COD dissolved in 1.5 ml of toluene) was added slowly, and after 5-10 minutes the solution became deep violet. The mixture was stirred vigorously at room temperature for one night. The starting material (2.03 g, 4 mmol) was then added as a solution in 10 ml of toluene, and the reaction mixture turned deep red. Further observations analogous to variant 1.

Example D3

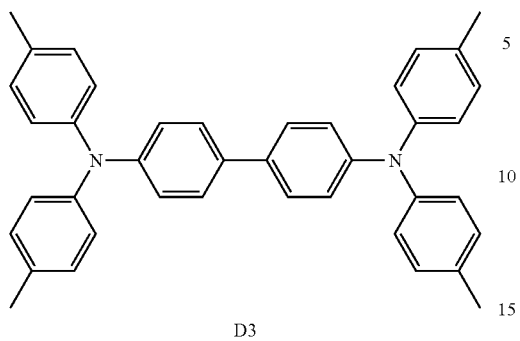

D3

Manganese (1.04 g, 18.9 mmol) and the catalyst solution (8.75 ml) were stirred at 50° C. for 10 minutes under argon. The mixture had a stable violet color. The starting material (4.54 g, 12.9 mmol) dissolved in 35 ml of toluene was then added, and the reaction mixture became deep red. The reaction mixture was stirred at 50° C. for 48 hours. The mixture was then cooled to room temperature, filtered through Celite and evaporated on a rotary evaporator. The residue was dissolved in $CH_2Cl_2$ and washed with 1M HCl (100 ml) and water. The organic phase was dried over $Na_2SO_4$, filtered and evaporated. The product was recrystallized from ethanol.

This gave 3.16 g (yield: 90%) of the desired product (D3) which according to HPLC had a purity of 99.9%.

$^1$H NMR (CDCl$_3$): 7.37 (4H, m); 7.20-6.90 (20H, m); 2.3 (12H, s).

A2: Preparation of Polymers

The preparation of appropriate monomers is described, inter alia, in the abovementioned unpublished applications DE 10114477.6 and DE 10143353.0; these are hereby incorporated by reference into the present invention.

Example P1

Copolymerization of 50 mol % of 2,7-dibromo-2',3',6',7'-tetra(2-methylbutyloxy)spirobifluorene (M1), 40 mol % of 2,7-dibromo-9-(2',5'-dimethyl-phenyl)-9-[3'',4''-bis(2-methylbutyloxy)phenyl]fluorene (M2), 10% of N,N'-bis(4-bromophenyl)-N,N'-bis(4-tert-butylphenyl)benzidine (M3) (Polymer P1).

Manganese (440 mg, 8 mmol) and the catalyst solution (2 ml) were stirred at 50° C. for 10 minutes under argon. The mixture was a stable violet color. The monomers (655 mg (0.8 mmol) of M1, 433 mg (0.64 mmol) of M2, 121 mg (0.16 mmol) of M3) were then added as a solution in 20 ml of toluene, and the reaction mixture turned red. The reaction mixture was stirred at 50° C. for 5 days. The mixture was then cooled to room temperature, diluted with 10 ml of toluene and filtered through Celite. The organic phase was washed 3× with HCl (50 ml) and with $H_2O$ and precipitated by introducing it dropwise into 500 ml of methanol. The polymer was dissolved in 50 ml of toluene, precipitated with 500 ml of MeOH, washed and dried under reduced pressure. The polymer was extracted with a 1/1 mixture of THF/MeOH in a Soxhlet extractor for 48 hours. The polymer was dissolved in 50 ml of toluene and reprecipitated once more in 500 ml of methanol, filtered off with suction and dried to constant mass. This gave 0.8 g (yield: 84%) of the polymer P1 as a solid.

$^1$H NMR (CDCl$_3$): 7.8-7.7 (m, 1H, spiro); 7.7-7.1 (m, 10.7H, fluorene, spiro, TAD); 6.6 (br. s, 0.8H, fluorene), 6.21 (m, 1H, spiro); 4.0-3.4 (3×m, 5.6H, OCH$_2$), 2.16 (s, 1.2H, CH$_3$); 1.9-0.7 (m, alkyl H, including t-butyl at 1.30). GPC: THF; 1 ml/min, Pigel 10 μm Mixed-B 2×300×7.5 mm$^2$, 35° C., RI detection: $M_w$=276400 g/mol, $M_n$=73500 g/mol.

The residual metal contents were also determined by ICP-AES-MS:

nickel<3 ppm, manganese<5 ppm (in each case below the detection limit).

Further polymers were prepared in a manner analogous to the descriptions for P1. The molecular weights $M_w$ and $M_n$ are summarized in the following table.

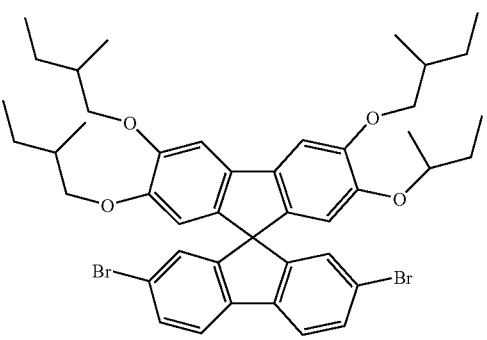

M1

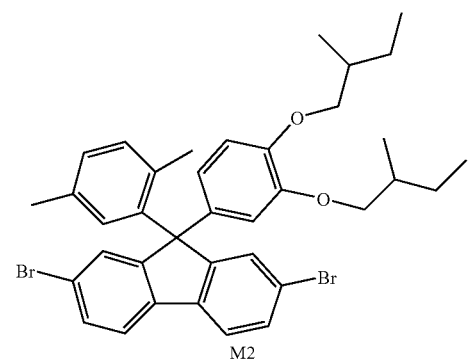

M2

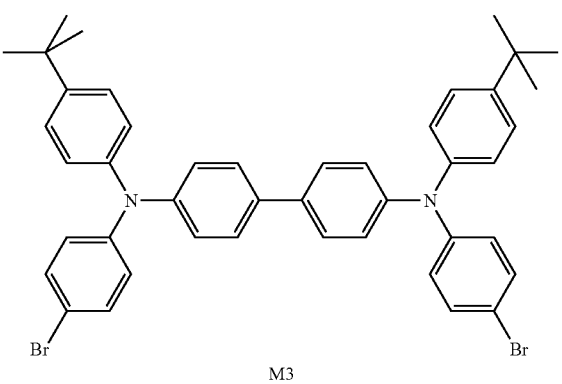

M3

-continued

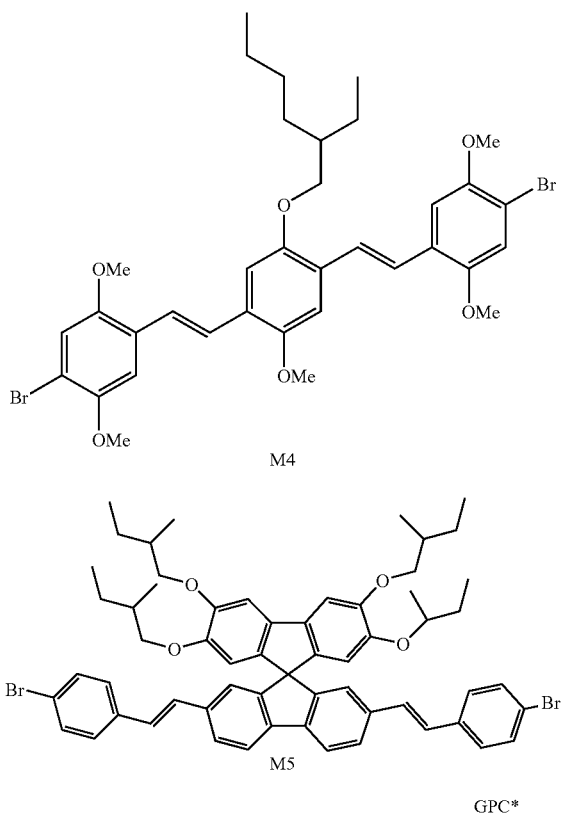

M4

M5

| Polymer | Proportion of monomers in the polymerization [%] | | | | | GPC* | |
|---|---|---|---|---|---|---|---|
| | M1 | M2 | M3 | M4 | M5 | $M_w$ (1000 g/mol) | $M_n$ (1000 g/mol) |
| P1 | 50 | 40 | 10 | | | 276 | 73 |
| P2 | 70 | | 10 | | 20 | 738 | 66 |
| P3 | | 80 | 10 | | 10 | 245 | 75 |
| P4 | | 70 | 10 | 20 | | 559 | 165 |
| P5 | 50 | | | 50 | | 270 | 55 |

*GPC: THF; 1 ml/min, Pigel 10 μm Mixed-B 2 × 300 × 7.5 mm², 35° C., RI detection

The invention claimed is:

1. A process for coupling aromatic or heteroaromatic halogen compounds to form one or more C—C single bonds, characterized in that an Ni(0) complex comprising at least two different ligands, with at least one ligand being selected from each of the two groups consisting of heteroatom-containing ligands (group 1) and of π system ligands (group 2), is used in catalytic amounts, and a reducing agent which converts consumed nickel back into Ni(0) is used;

the reaction takes place in an anhydrous, aprotic medium under a very largely inert atmosphere, with the proviso that no phosphorus-containing compound is added.

2. The process as claimed in claim 1, characterized in that it occurs in a single phase.

3. The process as claimed in claim 1, characterized in that the aromatic or heteroaromatic halogen compounds are aromatics or heteroaromatics having from 2 to 40 carbon atoms, which can be substituted by one or more linear, branched or cyclic alkyl or alkoxy radicals which have from 1 to 20 carbon atoms and in which one or more nonadjacent $CH_2$ groups can be replaced by O, C=O or a carboxy group, substituted or unsubstituted C2-C20-aryl or -heteroaryl radicals, fluorine, cyano, nitro groups or can also be unsubstituted.

4. The process as claimed in claim 3, characterized in tat the aromatics or heteroaromatics are substituted or unsubstituted derivatives of benzene, naphthalene, anthracene, pyrene, biphenyl, fluorene, spiro, 9,9'-bifluorene, phenanthrene, perylene, chrysene, naphthacene, pentacene, triptycene, pyridine, fliran, thiophene, beuzothiadiazole, pyrrole, quinoline, quinoxaline, pyrimidine or pyrazine.

5. The process as claimed in claim 1, characterized in that the catalyst is prepared beforehand.

6. The process as claimed in claim 1, characterized in that the catalyst is prepared in situ.

7. A process for preparing an Ni(0) complex as claimed in claim 1, characterized in that a reducing agent is mixed with an Ni(II) salt dissolved in DMF at room temperature, a ligand solution in toluene is slowly added and the mixture is stirred vigorously.

8. The process as claimed in claim 1, characterized in that the ligands of group 1 contain heteroatoms from main group 5 or 6, with the exception of phosphorus.

9. The process as claimed in claim 8, characterized in that the ligands contain nitrogen and/or oxygen.

10. The process as claimed in claim 8, characterized in that the ligands have two $\eta^1$ coordinations to the nickel, in each case via the heteroatoms.

11. The process as claimed in claim 1, characterized in that the ligands of group 2 have at least one $\eta^2$ coordination via a π system to the nickel.

12. The process as claimed in claim 11, characterized in that these ligands comprise alkyne or alkene groups.

13. The process as claimed in claim 11, characterized in that these ligands have two $\eta^2$ coordinations to the nickel, in each case via the π systems.

14. The process as claimed in claim 1, wherein relatively nonpolar solvents serve as solvent.

15. The process as claimed in claim 14, characterized in that pentane, cyclohexene, toluene or xylene serve as solvent.

16. The process as claimed in claim 14, characterized in that these solvents are mixed with inert, dipolar solvents.

17. The process as claimed in claim 16, characterized in that a mixture of DMF and toluene is used.

18. The process as claimed in claim 1, wherein said nonpolar solvent is an aliphatic and aromatic hydrocarbon.

19. The process as claimed in claim 15, characterized in that these solvents are mixed with an inert, dipolar solvent and said dipoloar solvent is N,N'-dimethylformamide, N,N'-dimethylacetamide, N-methylpyrrolidin-2-one, tetramethylurea, dimethyl sulfoxide or sulfolane.

* * * * *

UNITED STATES PATENT AND TRADEMARK OFFICE
CERTIFICATE OF CORRECTION

| | | |
|---|---|---|
| PATENT NO. | : 7,247,761 B2 | Page 1 of 1 |
| APPLICATION NO. | : 10/526955 | |
| DATED | : July 24, 2007 | |
| INVENTOR(S) | : Aurelie Falcou et al. | |

It is certified that error appears in the above-identified patent and that said Letters Patent is hereby corrected as shown below:

In the Claims:

In Claim 4, in column 18 and line 16, "fliran" should read -- furan --.

Signed and Sealed this

Eighteenth Day of December, 2007

JON W. DUDAS
*Director of the United States Patent and Trademark Office*